United States Patent [19]
Ausschnitt et al.

[11] Patent Number: 6,020,966
[45] Date of Patent: Feb. 1, 2000

[54] ENHANCED OPTICAL DETECTION OF MINIMUM FEATURES USING DEPOLARIZATION

[75] Inventors: Christopher P. Ausschnitt, Brookfield, Conn.; Christopher J. Progler, Hopewell Junction, N.Y.

[73] Assignee: International Business Machines Corporation, Armonk, N.Y.

[21] Appl. No.: 09/159,240

[22] Filed: Sep. 23, 1998

[51] Int. Cl.[7] .............................. G01J 4/00; G01N 21/00
[52] U.S. Cl. ............................................ 356/369; 356/237
[58] Field of Search .................................. 356/369, 237, 356/372, 375, 123, 124–127, 383, 384, 371, 386; 430/5

[56] References Cited

U.S. PATENT DOCUMENTS

| | | |
|---|---|---|
| 4,577,968 | 3/1986 | Makosch . |
| 4,701,606 | 10/1987 | Tanimoto et al. . |
| 4,779,001 | 10/1988 | Makosch . |
| 5,072,126 | 12/1991 | Progler . |
| 5,450,201 | 9/1995 | Katzir et al. ............................ 356/369 |
| 5,629,772 | 5/1997 | Ausschnitt . |
| 5,631,171 | 5/1997 | Sandstrom et al. ...................... 436/518 |
| 5,689,332 | 11/1997 | Ellingson et al. ....................... 356/237 |
| 5,706,088 | 1/1998 | Chao et al. .............................. 356/369 |

OTHER PUBLICATIONS

Norman Bobroff et al., "Alignment Errors From Resist Coating Topography," J. Vac. Sci. Technol. B, vol. 6, No. 1, Jan./Feb. 1988, pp. 403–408.

Max Born and Emily Wolf, Electromagnetic Theory of Propagation, Interference and Diffraction of Light, *Principles of Optics*, Sixth Edition, Pergamon Press, New York (1980).

*Primary Examiner*—Frank G. Font
*Assistant Examiner*—Layla Lauchman
*Attorney, Agent, or Firm*—Ratner & Prestia; Tiffany L. Townsend

[57] ABSTRACT

Optical measurement of image shortening on a lithographically formed minimum feature is enhanced using crossed-polarizer imaging. The minimum feature, which is comprised of a nested array of lines having a width and space corresponding to the critical dimension of interest, is caused to maintain a preferred optical polarization axis due to the repeating nature of the nested pattern. The preferred optical polarization axis causes the transfer of some of the linearly polarized illumination into a new polarization orientation which is sympathetic with a crossed polarizer located in the detection channel of the optical imaging system. The crossed polarizer then allows the light reflected from the nested feature to pass to a detector, while extraneous (background) light is rejected. This results in a high contrast image of the nested feature that facilitates the determination of width, and that reduces measurement variability as a function of the optical properties of the nested feature.

29 Claims, 4 Drawing Sheets

INCIDENT

INTERACTION

REFLECTED

DETECTED

ENHANCED OPTICAL DETECTION OF MINIMUM FEATURES USING DEPOLARIZATION

TECHNICAL FIELD

The present invention is generally directed to lithographic processes and, more particularly, to enhanced monitoring of the pattern features produced during the lithographic process.

BACKGROUND OF THE INVENTION

Lithographic processes are commonly used to produce a pattern in a photoresist film formed on a substrate to develop a desired integrated circuit product. A variety of systems are known for accomplishing such a result. Principal factors for determining the quality (primarily the shape) of the produced image include "exposure" (illumination time and intensity) and "focus" (the position of the photoresist film relative to the focal plane of the imaging system).

To ensure that the patterns being produced are kept within acceptable tolerances, a common practice is to monitor (measure) the dimensions of the patterns to account for potential variations in processing, primarily resulting from variations in exposure and focus. The importance of such monitoring increases as the size of the features being produced decreases. The difficulty in monitoring such features also increases, however, as the size of the features decreases. This difficulty is exacerbated for features having a size on the order of one micron or less. This is because the use of a scanning electron microscope (SEM) to perform such inspections, as is generally preferred, tends to be relatively slow in operation and difficult to automate for features of a smaller size. The use of optical tools would permit faster and more readily automated operations to be implemented, but such optical techniques were generally considered to be inadequate to resolve features of a smaller size, particularly those having dimensions of less than about one micron.

To overcome this problem, U.S. Pat. No. 5,629,772 (issued to Ausschnitt) discloses an optical system capable of resolving features of a smaller size for measuring the bias (i.e., variation) of a minimum feature in a lithographic process. To this end, an array of elements having a width and space corresponding to the minimum feature is created. Length changes of an element in the array (resulting from image-shortening effects due to the lithographic process) are then measured and the bias of the element is calculated in the width dimension. A test site having groups of elements in the array is then defined to facilitate automatic bias measurement of array lengths and separations, allowing the use of optical (non-SEM) tools which would otherwise have been incapable of measuring the minimum feature widths being monitored.

In practice, however, difficulties were encountered when monitoring minimum features using the techniques disclosed in U.S. Pat. No. 5,629,772 (i.e., an end-of-line monitoring, or metrology, of a nested line pattern developed in the test site defined for the grouped array of elements). For example, a key problem encountered was the interaction of sublayer films with the measurement structure. A typical overall measurement structure might include a lithographically formed, nested line pattern 1 developed in the photoresist 2, on top of a series of thin sublayer films 3, 4 such as silicon dioxide or silicon nitride. Sublayer films 3, 4 are formed on a substrate 7 such as a silicon wafer. Such a structure is shown in FIGS. 1A and 1B.

The underlying films 3, 4 can bias the value of the line-shortening measurement due to optical interactions between the photoresist line pattern 1 and the sublayer films 3, 4, as shown in FIG. 2. As the thickness of the sublayer films 3, 4 is varied, the reflectivity of the measurement target varies, in turn biasing the measurement of line length for the nested features. The ideal detection scheme would therefore permit the detection of light reflected from the nested line pattern 1 while rejecting the light generated in the underlying films 3, 4.

One method that can be used to reject extraneous light, in the context of an optical alignment of lithographic features, is described by N. Bobroff et al., "Alignment Errors From Resist Coating Topography," J. Vac. Sci. Technol. B, Vol. 6, No. 1, pp. 403–08 (January/February 1988). The disclosed method uses darkfield illumination for lithographic alignment. With reference to FIG. 3, darkfield illumination 5 allows the rejection of the specular component 6 of reflected intensity, in this way minimizing interaction of the substrate films 3, 4 with lithographic alignment. Another method that can be used to reject extraneous light is described in U.S. Pat. No. 4,779,001 (issued to Makosch). In this case, the disclosed system uses polarized light with a single wavelength for illumination in the context of optical alignment performed in conjunction with a pair of nested line gratings. In practice, however, neither of these systems has proven to be entirely satisfactory.

Therefore, the primary object of the present invention is to provide a system for effectively monitoring a nested line pattern developed in a defined test site using an optical tool to detect line shortening for purposes of optical width measurement. Another object of the present invention is to provide a system for monitoring a nested line pattern developed in a defined test site which eliminates extraneous light from the sublayer thin films associated with the substrate, to provide greater insensitivity to the substrate films. Still another object of the present invention is to provide a system for monitoring a nested line pattern developed in a defined test site which permits the use of broadband illumination to permit imaging of the defined test site over a broad range of wavelengths.

SUMMARY OF THE INVENTION

These and other objects, which will become apparent, are achieved in accordance with the present invention by enhancing the optical measurement of image shortening on a lithographically formed minimum feature through the use of crossed-polarizer imaging. The minimum feature, which is comprised of a nested array of lines having a width and space corresponding to the critical dimension of interest, is caused to maintain a preferred optical polarization axis due to the repeating nature of the nested pattern. The preferred optical polarization axis causes the transfer of some linearly polarized illumination (light) into a new polarization orientation which is sympathetic with a crossed polarizer located in the detection channel of the optical imaging system. The crossed polarizer then allows the light reflected from the nested feature to pass to a detector, while extraneous (background) light is rejected.

The apparatus of the present invention produces a high-contrast image of the nested feature that facilitates the determination of width. The invention also reduces measurement variability as a function of the optical properties of the nested feature. Advantages of such an apparatus include greater insensitivity to substrate films due to imaging over a broad range of wavelengths, applicability of the technique to optical line end shortening metrology, and an absence of a need for moving optical components during the detection procedure.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, the dimensions of the various features are arbitrarily expanded or reduced for clarity. Included in the drawing are the following figures.

DETAILED DESCRIPTION OF A PREFERRED EMBODIMENT

In accordance with the present invention, line end shortening is optically detected by detecting line end shortening features through a pair of crossed optical polarizers. A series of features to be monitored (e.g., nested features used for line end shortening metrology) are illuminated with appropriately orientated, linearly polarized light, causing a fraction of the illumination produced to become depolarized due to the nested nature of the measurement structure. The light reflected from the nested line pattern is then detected through a polarizer which is rotated at or about 90 degrees relative to the illumination polarizer. Consequently, a certain amount of extraneous light is rejected. This, in turn, results in improved measurement sensitivity and accuracy.

In the context of the present invention, the term "polarization" refers to the orientation and nature of the vibrations of the electric field vector from the optical light involved in the detection process. A "linearly polarized" light beam will have a plane of vibration that is fixed along a particular direction as the light propagates through space. A "linear polarizer" refers to an optical element that can create linearly polarized light from a general, non-linearly polarized input beam. A linear polarizer can also serve as a filter, to remove a component of linearly polarized light in an input beam, if the linear polarizer is rotated at or about 90 degrees relative to an input linear polarization state. The terms "polarization," "linear polarization," and "linear polarizer" are known concepts in elementary optical physics. A further discussion of such terms may be found, for example, in Born and Wolf, *Principles of Optics*, Pergamon Press, New York (1980).

Figure 1A:
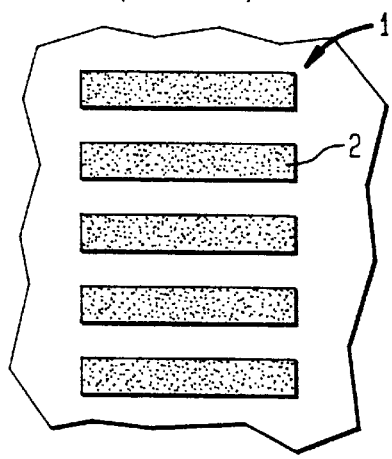
FIG. 1A is a top, schematic illustration of a nested line pattern for monitoring minimum features of a structure.
Figure 1B:
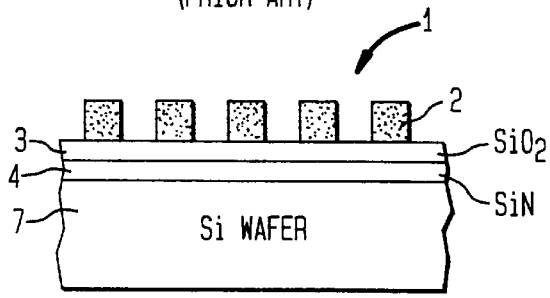
FIG. 1B is an end, schematic illustration of the nested line pattern for monitoring minimum features of the structure shown in FIG. 1A.
Figure 2:
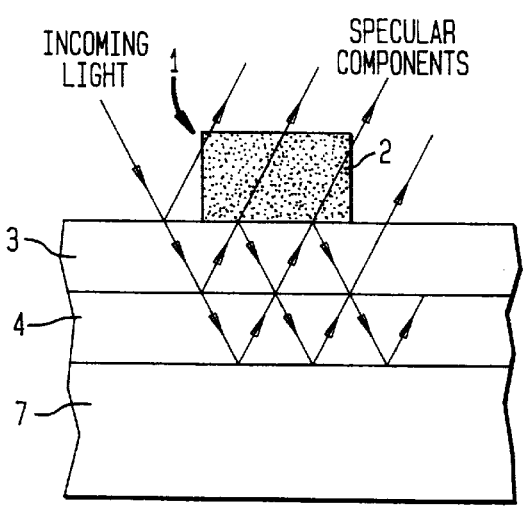
FIG. 2 is a schematic illustration showing the origin of interference and contrast losses from the underlying films of the structure shown in FIGS. 1A and 1B.
Figure 3:
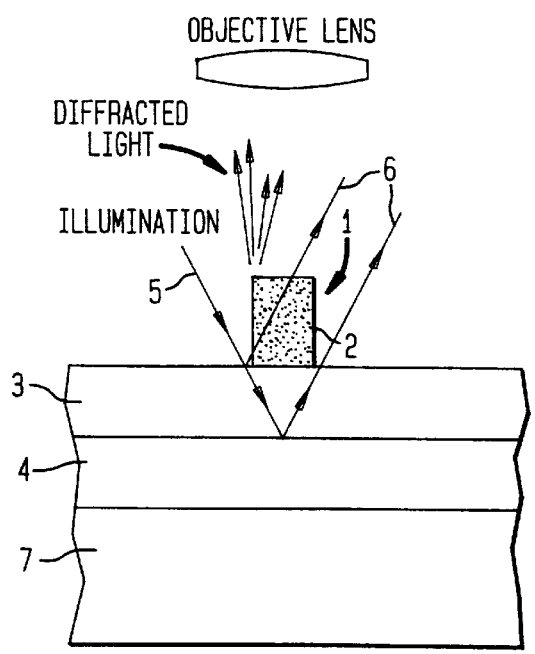
FIG. 3 is a schematic illustration showing the injection of specular components through darkfield illumination.
Figure 4:
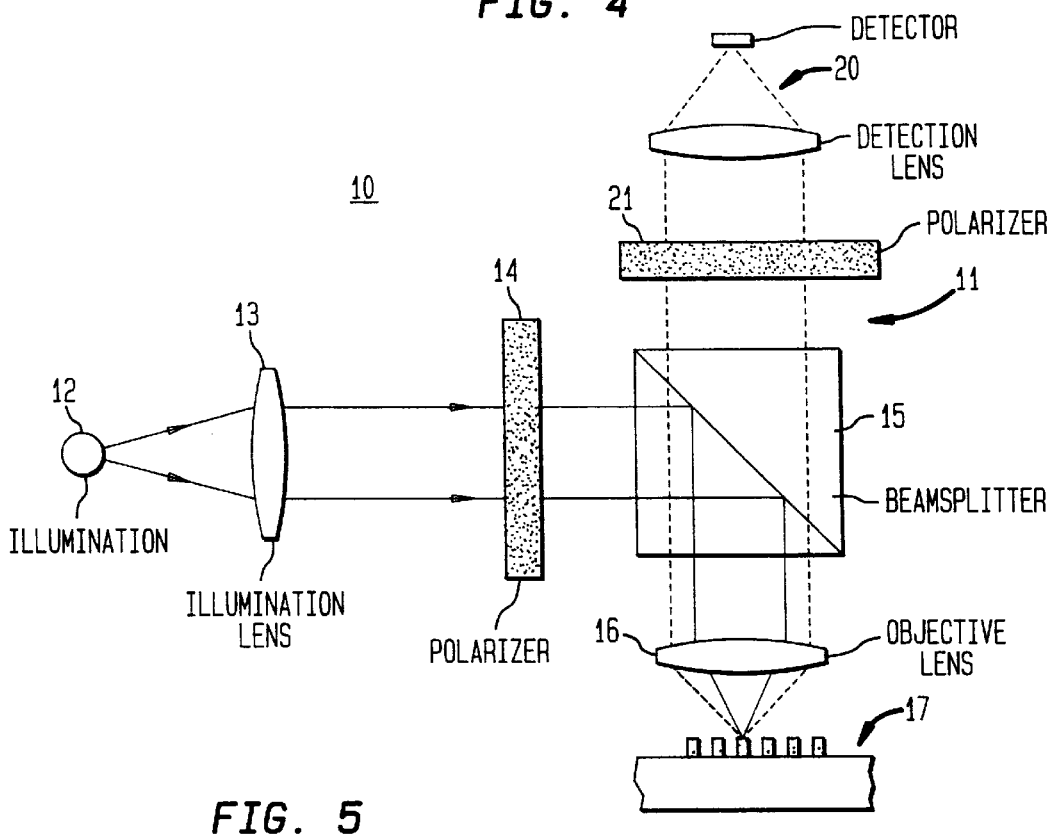
FIG. 4 is a schematic illustration of a preferred embodiment optical viewing microscope incorporating crossed-polarizer imaging in accordance with the present invention.

FIG. 4 shows a preferred embodiment system 10 for implementing the improvements of the present invention. The system 10 has an optical viewing microscope 11 that uses polarized light for purposes of illumination and detection to measure line end shortening. To this end, an illumination source 12 and lens 13 combine to project light through a broadband linear polarizer 14 (e.g., a stack polarizer or a Brewster angle polarizer). Light (illumination) passing through the linear polarizer 14 is then passed through a beam splitter 15, and is directed toward the objective lens 16 of the microscope 11. The objective lens 16 of the microscope 11 must be suitable for use with polarized light (i.e., the objective lens 16 must be relatively strain free and must not significantly perturb the polarization state of the incoming radiation).

The linearly polarized light (illumination) is then directed onto the nested line end shortening measurement structure 17. At this point, and referring to FIG. 5, the orientation or angle of the illumination polarization (shown at 18) is preferably at or about 45 degrees relative to the orientation (shown at 19) of the nested line pattern 1.

Figure 6:
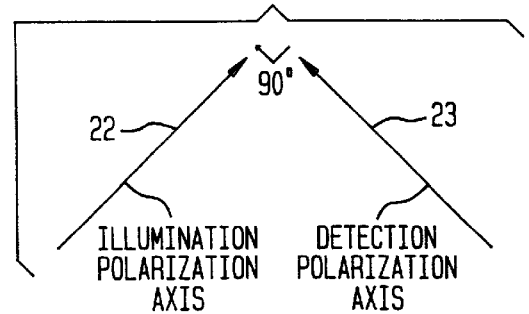
FIG. 6 is a schematic illustration showing the preferred illumination and polarization angles for the apparatus of the present invention.
Figure 7A:
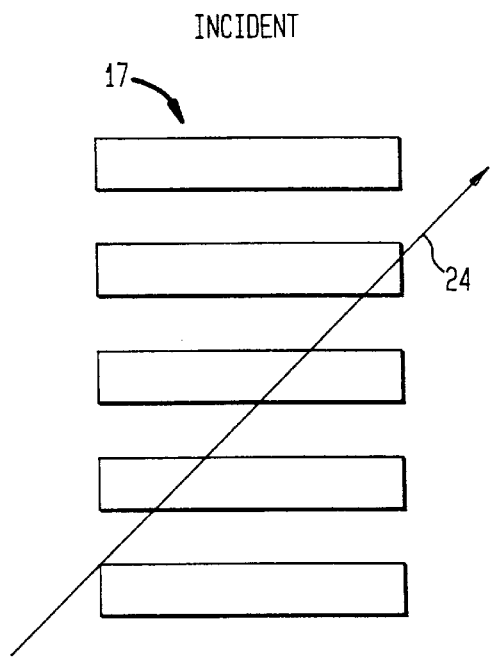
FIGS. 7A, 7B, 7C, and 7D are schematic illustrations which show the illumination and detection operations achieved in accordance with the present invention.
Figure 7B:
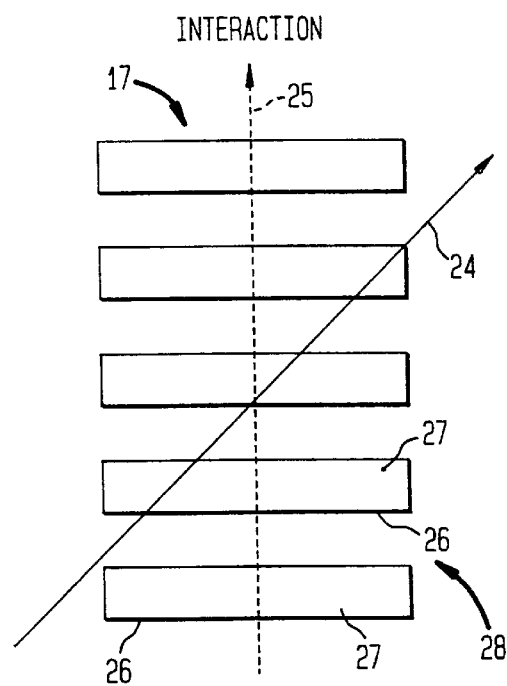
Figure 7C:
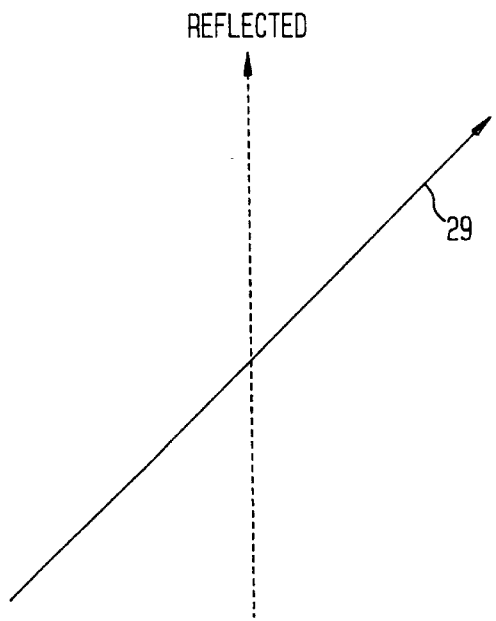
Figure 7D:
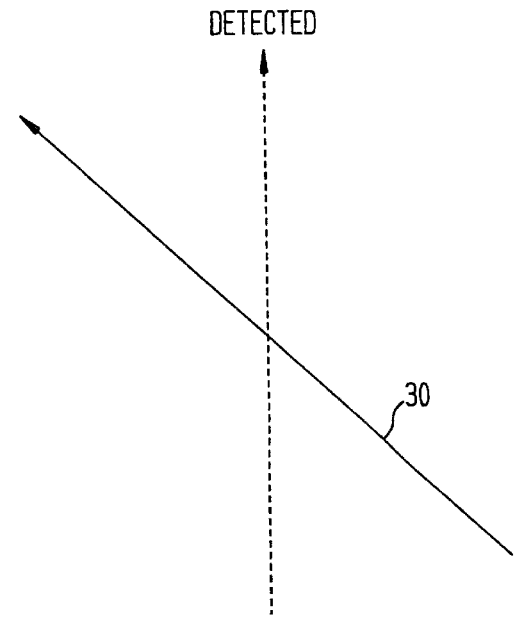

The linearly polarized light impinging on the measurement structure 17 is then reflected back along the path of the incident illumination. The reflected light (light intensity) is transmitted by the beam splitter 15 into a detection channel 20. The reflected light intensity entering the detection channel 20 is passed through a second polarizer 21 having an orientation which is preferably at or about 90 degrees relative to the orientation of the polarizer 14 (in the illumination channel). This 90-degree rotation is best illustrated with reference to FIG. 6, which show the polarization axis 22 of the illumination polarizer 14 and the polarization axis 23 of the detection polarizer 21, respectively. It is only important for the polarizers 14, 21 to be oriented correctly relative to the measurement structure 17, and to each other. The absolute angle of polarization relative to a reference standard is not important.

Figure 5:
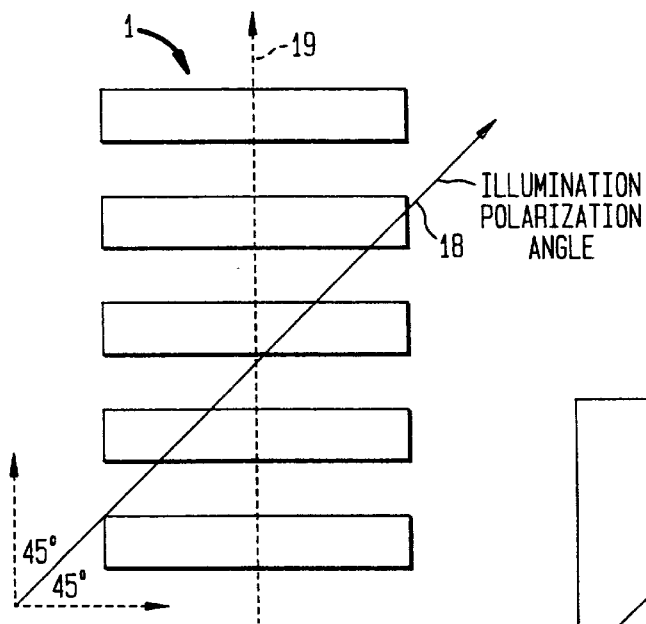
FIG. 5 is a schematic illustration showing the preferred orientation of the illumination polarization relative to the pattern being measured.

The physical mechanism for allowing detection of the nested line pattern 1 at orientation 19 of FIG. 5 through the crossed linear polarizers 14, 21 of FIG. 4 is best explained with reference to FIGS. 7A through 7D. In practice, some fraction of the light polarized at 45 degrees relative to the nested line measurement structure 17 (the incident illumination 24 of FIG. 7A) will be transferred out of the linear polarization state. In effect, a component of the linear incident polarization 24 excites the measurement structure 17 along a direction (shown at 25 in FIG. 7B) which is perpendicular to the line edge 26 of each element 27 of the grating 28. The grating 28 then radiates optical intensity polarized in a direction not found in the incident illumination beam.

The detection polarizer 21 is oriented at or about 90 degrees relative to the input polarizer 14 to block out the specularly reflected component of incident illumination which does not have its polarization direction rotated by the measurement structure 17 (the component 29 shown in FIG.

7C). Therefore, only the light excited by the measurement structure itself is detected (the component 30 shown in FIG. 7D). The result is an image with a high signal-to-noise ratio and with little or no specularly reflected background component.

The consequent improvements become apparent when comparing a photographic recording of the detection process of the present invention with a normal brightfield microscope image of a series of nested line end shortening patterns. For the same pattern, only the nested line patterns of the image viewed with the crossed-polarizer detection method of the present invention will generally be visible. The background intensity will generally be rejected. Moreover, in addition to removal of the background, the crossed-polarizer detection method eliminates most of the non-nested pattern features, further facilitating pattern recognition of the nested line end shortening features. By orienting the nested line patterns at or about 45 degrees relative to the incoming polarization axis, the pattern is rotated to be coincident with the incoming polarization and a complete extinction of the image is realized after the light passes through the linear polarizer of the detection channel.

The strength of the detected polarized signal is proportional to the length of the lines in the nested line end measurement structure 17 and the number of repeating (measurement) periods. In its preferred embodiment, the nested line structure should include at least 10, and preferably at least 100, repeating line patterns. Nested line structures having many hundreds of repeating line patterns can be implemented using presently existing technology. The length of each line should be long when compared to its width. For example, in its preferred embodiment, the length of each line should be at least two times its width, and preferably 10 or more times its width.

Although the preferred angle for the polarizers 14, 21 relative to the measurement structure 17 has previously been specified to be at or about 45 degrees, other angles may also be suitable. In addition, although the preferred angle between the illumination polarizer 14 and the detection polarizer 21 has previously been specified to be at or about 90 degrees, other angles nay similarly be suitable. It is most critical for the measurement structure 17 to be illuminated with polarized light, and for the measurement structure 17 (because of its fundamental layout properties, such as long nested repeating features) to transfer some component of the incident illumination into another illumination state. This other polarization state is then allowed to pass through the polarizer 21 located in the detection channel 20 of the measurement system 10.

The previously mentioned angles are considered preferred because such angles will generally yield optimum optical signal-to-noise ratios. Different angles may be chosen, however, for a particular application to increase the overall amount of light incident to the detection plane. In essence, such an arrangement creates mixed brightfield and polarization imaging.

Figure 8:
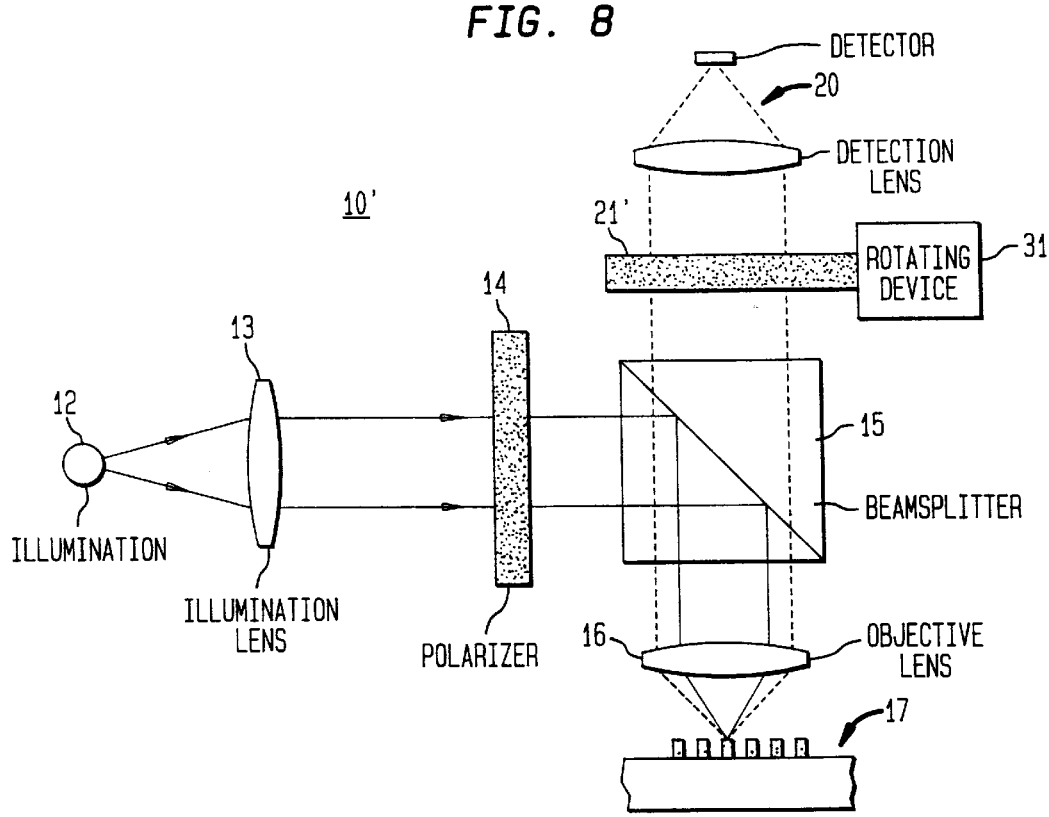
FIG. 8 is a schematic illustration showing the use of crossed-polarizer imaging in accordance with the present invention in combination with brightfield or darkfield imaging to develop a dual mode of operation.

As an alternative, the previously described crossed-polarizer imaging techniques can be used in conjunction with brightfield or darkfield imaging to develop a dual mode of operation. Referring to FIG. 8, this is accomplished by combining the information generated using crossed-polarizer imaging with information generated using conventional brightfield or darkfield imaging. To this end, the optical system 10 shown in FIG. 4 is modified so that the detection polarizer 21 rotates during detection using optical components (schematically shown at 31 in FIG. 8) that are otherwise known. When the rotating detection polarizer 21' of the optical system 10' of FIG. 8 is aligned with the illumination polarizer 14, conventional imaging information is acquired. When the rotating detection polarizer 21' is crossed with the illumination polarizer 14, crossed-polarizer imaging results. The resulting data (from the conventional imaging channel and from the crossed-polarizer imaging channel) are then combined, preferably through real time averaging or some other known post processing operation.

Figure 9:
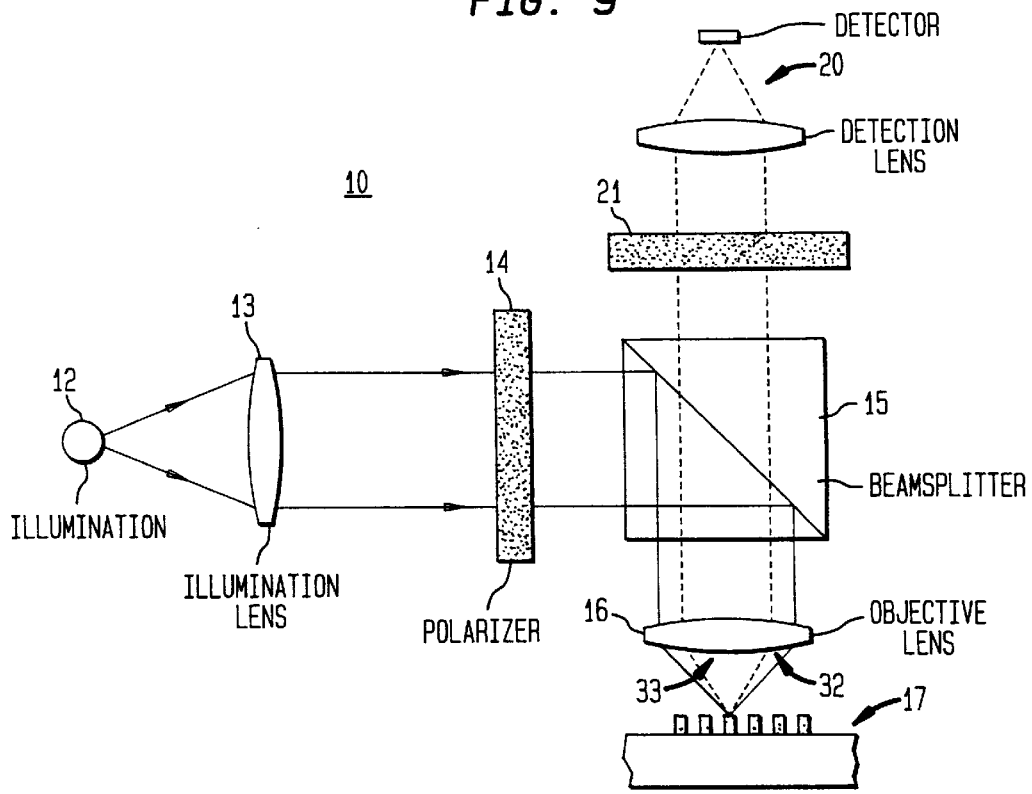
FIG. 9 is a schematic illustration showing the use of crossed-polarizer imaging in accordance with the present invention in combination with darkfield illumination.

Yet another alternative is to combine the previously described crossed-polarizer imaging techniques with darkfield illumination of the measurement structure 17. In this configuration, and referring to FIG. 9, darkfield illumination is produced by directing light (imaging) through outer portions 32 of the objective lens 16. As previously described, this illumination (light) will have already passed through the linear polarizer 14. Light scattered by the minimum feature associated with the measurement structure 17 returns through center portion 33 of the objective lens 16, subsequently passing through the linear polarizer 21 (which is rotated 90 degrees relative to the linear polarizer 14). In this way, specular light is rejected using (simultaneously) both darkfield illumination and crossed-polarizer imaging.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An apparatus for optically measuring line end shortening in a nested line pattern formed on a substrate, comprising:

an optical tool having a source of illumination and a first polarizer coupled with the source of illumination, wherein the first polarizer is positioned so that light from the source is directed through the first polarizer and onto the nested line pattern; and a detector associated with the optical tool and a second polarizer coupled with the detector, wherein the second polarizer is positioned to receive light reflected from the nested line pattern and to pass the light reflected from the nested line pattern to the detector, and wherein the second polarizer is rotated relative to the first polarizer.

2. The apparatus of claim 1 wherein the optical tool is an optical viewing microscope.

3. The apparatus of claim 1 wherein the polarizers are linear polarizers.

4. The apparatus of claim 3 wherein the first linear polarizer is rotated approximately 90 degrees relative to the second linear polarizer.

5. The apparatus of claim 1 wherein the nested line pattern includes a plurality of lines having a specified length and space which define an orientation for the nested line pattern.

6. The apparatus of claim 5 wherein the source and the first polarizer combine to define an illumination polarization axis, and wherein the illumination polarization axis is oriented approximately 45 degrees relative to the orientation of the nested line pattern.

7. The apparatus of claim 5 wherein the lines have a width, and wherein the length of the lines is at least two times the width.

8. The apparatus of claim 7 wherein the length of the lines is at least 10 times the width.

9. The apparatus of claim 1 wherein the nested line pattern is a repeating line pattern, and wherein the nested line pattern includes at least 10 repeating line patterns.

10. The apparatus of claim 9 wherein the nested line pattern includes at least 100 repeating line patterns.

11. The apparatus of claim 1 which further includes means for rotating the second polarizer relative to the first polarizer.

12. The apparatus of claim 1 wherein the optical tool includes an objective lens, wherein the light is directed onto the feature through outer portions of the objective lens, and wherein the reflected light is received from the feature through a center portion of the objective lens.

13. A method for optically measuring line end shortening in a nested line pattern formed on a substrate, using an optical tool having a source of illumination and a detector, the method comprising the steps of:

positioning the optical tool to direct light from the source, through a first polarizer coupled with the source and onto the nested line pattern; and receiving light reflected from the nested line pattern through a second polarizer coupled with the detector, and passing the reflected light received through the second polarizer to the detector, wherein the second polarizer is rotated relative to the first polarizer.

14. The method of claim 13 wherein the polarizers are linear polarizers, and which further includes the step of rotating the first linear polarizer approximately 90 degrees relative to the second linear polarizer.

15. The method of claim 13 wherein the feature is a nested line pattern including a plurality of lines having a specified length and space which define an orientation for the nested line pattern, wherein the source and the first polarizer combine to define an illumination polarization axis, and wherein the method further includes the step of orienting the illumination polarization axis approximately 45 degrees relative to the orientation of the nested line pattern.

16. The method of claim 13 wherein the feature is a nested line pattern including a plurality of lines having a specified length and width, and wherein the method further includes the step of providing the lines with a length that is at least two times the width.

17. The method of claim 16 wherein the lines are provided with a length that is at least 10 times the width.

18. The method of claim 13 wherein the feature is a nested line pattern including a plurality of lines having a specified length and space, wherein the nested line pattern is a repeating line pattern, and wherein the method further includes the step of providing the nested line pattern with at least 10 repeating line patterns.

19. The method of claim 18 wherein the nested line pattern is provided with at least 100 repeating line patterns.

20. The method of claim 13 which further includes the steps of transferring a first component of the light from the source out of a linear polarization state defined by the first polarizer, by directing the light onto the feature, and filtering a second component of the light from the source that has not been transferred out of the linear polarization state using the second polarizer.

21. The method of claim 13 which further includes the step of rotating the second polarizer relative to the first polarizer.

22. A method for monitoring bias, in a feature formed on a substrate, using an optical tool having a source of illumination and a detector, the method comprising the steps of:

positioning the optical tool to direct light from the source onto the feature, and positioning the detector to receive light reflected from the feature;

passing the light from the source through a first polarizer, and passing the light reflected from the feature through a second polarizer;

rotating the second polarizer relative to the first polarizer, wherein the rotating develops a dual mode of operation including a first component resulting from crossed-polarizer imaging and a second component resulting from brightfield or darkfield illumination; and combining the first component with the second component.

23. The method of claim 22 wherein the combining includes real time averaging of the first component with the second component.

24. A method for monitoring bias, in a feature formed on a substrate, using an optical tool having a source of illumination and a detector, the method comprising the steps of:

positioning the optical tool to direct light from the source onto the feature, and positioning the detector to receive light reflected from the feature;

passing the light from the source through a first polarizer, and passing the light reflected from the feature through a second polarizer;

rotating the second polarizer relative to the first polarizer; and applying darkfield illumination to the feature.

25. The method of claim 24 wherein the optical tool includes an objective lens, and which further includes the steps of directing the light onto the feature through outer portions of the objective lens, and receiving the reflective light from the feature through a center portion of the objective lens.

26. The apparatus of claim 1 further comprising means coupled with the detector for measuring the line end shortening responsive to the reflected light passed to the detector.

27. The apparatus of claim 5 wherein the plurality of lines have a specified width, and wherein the source, the first polarizer, the detector, and the second polarizer combine to measure variations in the width of the lines.

28. The method of claim 13 further comprising the step of measuring the line end shortening responsive to the reflected light passed to the detector.

29. The method of claim 13 wherein the nested line pattern includes a plurality of lines having a specified width, and wherein the source, the first polarizer, the detector, and the second polarizer combine to measure variations in the width of the lines.

\* \* \* \* \*